United States Patent
Woo et al.

(10) Patent No.: US 10,304,933 B1
(45) Date of Patent: May 28, 2019

(54) TRENCH POWER MOSFET HAVING A TRENCH CAVITY

(71) Applicant: SEMICONDUCTOR COMPONENTS INDUSTRIES, LLC, Phoenix, AZ (US)

(72) Inventors: Sangsu Woo, Incheon (KR); Jongho Park, Incheon (KR); SeWoon Kim, Bucheon (KR); SangYong Lee, Incheon (KR); Youngkwon Kang, Bucheon (KR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/960,819

(22) Filed: Apr. 24, 2018

(51) Int. Cl.
| | |
|---|---|
| *H01L 29/66* | (2006.01) |
| *H01L 29/40* | (2006.01) |
| *H01L 29/78* | (2006.01) |
| *H01L 21/321* | (2006.01) |
| *H01L 21/28* | (2006.01) |
| *H01L 29/06* | (2006.01) |

(52) U.S. Cl.
CPC ...... *H01L 29/407* (2013.01); *H01L 21/28035* (2013.01); *H01L 21/3212* (2013.01); *H01L 29/0649* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 7,768,064 B2 * | 8/2010 | Sapp | ............ | H01L 29/407 |
| | | | | 257/330 |
| 7,859,047 B2 | 12/2010 | Kraft et al. | | |
| 8,362,550 B2 | 1/2013 | Rexer et al. | | |
| 8,610,205 B2 * | 12/2013 | Probst | ............ | H01L 29/401 |
| | | | | 257/333 |
| 10,163,639 B2 * | 12/2018 | Shea | ............ | H01L 21/28035 |
| 10,164,088 B2 * | 12/2018 | Shea | ............ | H01L 29/7813 |
| 2014/0273374 A1 * | 9/2014 | Yedinak | ............ | H01L 29/66727 |
| | | | | 438/272 |
| 2015/0349091 A1 * | 12/2015 | Yilmaz | ............ | H01L 29/66666 |
| | | | | 438/270 |

OTHER PUBLICATIONS

P. Moens et al., "UltiMOS: A Local Charge-Balanced Trench-Based 600V Super-Junction Device," Proceedings of the 23rd International Symposium on Power Semiconductor Devices & IC's, May 23-26, 2011, San Diego, CA.

* cited by examiner

*Primary Examiner* — Minh Loan Tran
(74) *Attorney, Agent, or Firm* — Brake Hughes Bellerman LLP (57) ABSTRACT

A transistor includes a trench defined in a semiconductor substrate. A gate electrode is disposed in the trench and insulated from a sidewall of the trench by a gate dielectric. A shield electrode is disposed in the trench below the gate electrode and insulated from the gate electrode and the sidewall of the trench by a shield dielectric. The shield dielectric includes solid dielectric portions and a cavity disposed between the shield electrode and the sidewall of the trench.

20 Claims, 12 Drawing Sheets

TRENCH POWER MOSFET HAVING A TRENCH CAVITY

TECHNICAL FIELD

The present disclosure relates to relates to semiconductor devices such as a trench power metal-oxide-semiconductor field-effect transistor (MOSFET) device, and in particular, to a shielded gate trench MOSFET device.

BACKGROUND

The capacitive characteristics of a semiconductor device can affect device performance in an adverse fashion. Metal-oxide-semiconductor field-effect transistor (MOSFET) devices having, for example, a high gate-drain capacitance (Cgd) can be problematic for at least some device applications. Some MOSFET devices can have a shield electrode and a gate electrode disposed within a dielectric filled trench. The combination of the shield electrode and gate electrode within the MOSFET device can be advantageous over conventional MOSFET devices that have only a gate electrode in that the shield electrode can help reduce the Cgd and improve the breakdown voltage of the transistor. With the miniaturization of electronic devices, cell pitches, and sizes of device features (e.g., D, the separation of the capacitor plates), even trench MOSFET devices having shielded gate configurations may have high gate-drain capacitances undesirable for device applications.

SUMMARY

In at least one general aspect, a transistor can include a trench defined in a semiconductor substrate and having a sidewall, and a gate electrode disposed in the trench and insulated from the sidewall of the trench by a gate dielectric. The transistor can include a shield electrode disposed in the trench below the gate electrode and insulated from the gate electrode and the sidewall of the trench by a shield dielectric. The shield dielectric can include a cavity disposed between the shield electrode and the sidewall of the trench.

In another general aspect, a transistor can include a trench defined in a semiconductor substrate and having a sidewall, and a gate electrode disposed in the trench and insulated from the sidewall of the trench by a gate dielectric. The transistor can include a shield electrode disposed in the trench below the gate electrode and insulated from the gate electrode. The transistor can also include a shield dielectric having a first portion aligned along a sidewall of the shield electrode and a second portion aligned along the sidewall of the trench where the first portion of the shield dielectric and the second portion of the shield dielectric define a cavity within the trench.

In yet another general aspect, a method can include forming a trench in a semiconductor substrate, and forming a bottom dielectric in the trench. The method can include forming a shield electrode on the bottom dielectric in the trench and forming a shield dielectric surrounding the shield electrode in the trench where the shield dielectric includes an open cavity between the shield electrode and a sidewall of the trench. The method can include forming a plug dielectric portion in the trench to enclose the open cavity in the trench.

BRIEF DESCRIPTION OF THE DRAWINGS

Like reference characters or numerals represent like elements throughout the various drawings.

DETAILED DESCRIPTION

Vertical channel or trench gate metal-oxide-semiconductor field-effect transistor (MOSFET) devices may be used, for example, in power device applications. In a trench gate MOSFET device, the source, gate, and drain regions are arrayed in a vertical direction of a semiconductor substrate. Source and drain terminals may be placed on opposite sides of a semiconductor substrate, and a gate electrode may be disposed in dielectric material in a trench that is etched in the semiconductor substrate. This vertical configuration may be suitable for a power MOSFET device, as more surface space can be used as a source, and also the source and drain separation can be reduced. Reduction of the source and drain separation can increase the drain-to-source current ratings and also can allow use of an epitaxial layer for the drain drift region to increase the voltage blocking capability of the device.

In a shielded gate MOSFET device, a deep trench can include an additional shield electrode disposed in dielectric material (e.g., silicon dioxide) below the gate electrode. The shield electrode can be used to reduce the gate-drain capacitance (Cgd) (which is related to the gate-drain charge Qgd), and/or improve the breakdown voltage of the gate trench MOSFET device.

In the example shielded gate trench MOSFET devices described herein, the capacitance (e.g., Cgd) of the trench structures in the MOSFET devices is further reduced by using a shield dielectric that has an effective dielectric constant that is less than the dielectric constants of solid dielectric materials. For example, the shield dielectric may include one or more gas-filled (e.g., air-filled) cavities (dielectric constant ~1.0) disposed between (e.g., interposed between) the shield electrode and a sidewall of the trench in which the shield electrode is disposed, in accordance with the principles of the present disclosure. The effective dielectric constant of the example shield dielectric with one or more gas cavities may be less than the dielectric constant of the solid materials used in the shield dielectric. In some implementations, the effective dielectric constant may, for example, be an average value (e.g., a weighted average) of the dielectric constant ($\kappa$>1.0) of the solid materials used in the shield dielectric and the dielectric constant ($\kappa$=1.0) of a gas (e.g., air).

The shielded gate trench MOSFET devices described herein include a gate electrode and a shield electrode disposed in a trench in a semiconductor substrate. The shield electrode is disposed below the gate electrode in the trench in a shield dielectric deeper in the trench body toward the trench bottom. The shield electrode can be embedded in, or surrounded by, the shield dielectric that extends from surfaces of the shield electrode to sidewalls of the trench. The shield dielectric includes (e.g., defines) solid dielectric material portions and one or more gas cavities disposed between surfaces of the shield electrode and sidewalls of the trench, in accordance with the principles of the disclosure herein.

The cross-sectional diagrams illustrated in the figures and described below are representative drawings. Processing variations, variations in aspect ratios, differences in design dimensions, and/or so forth can result in different shapes and/or non-idealities.

Figure 1A:
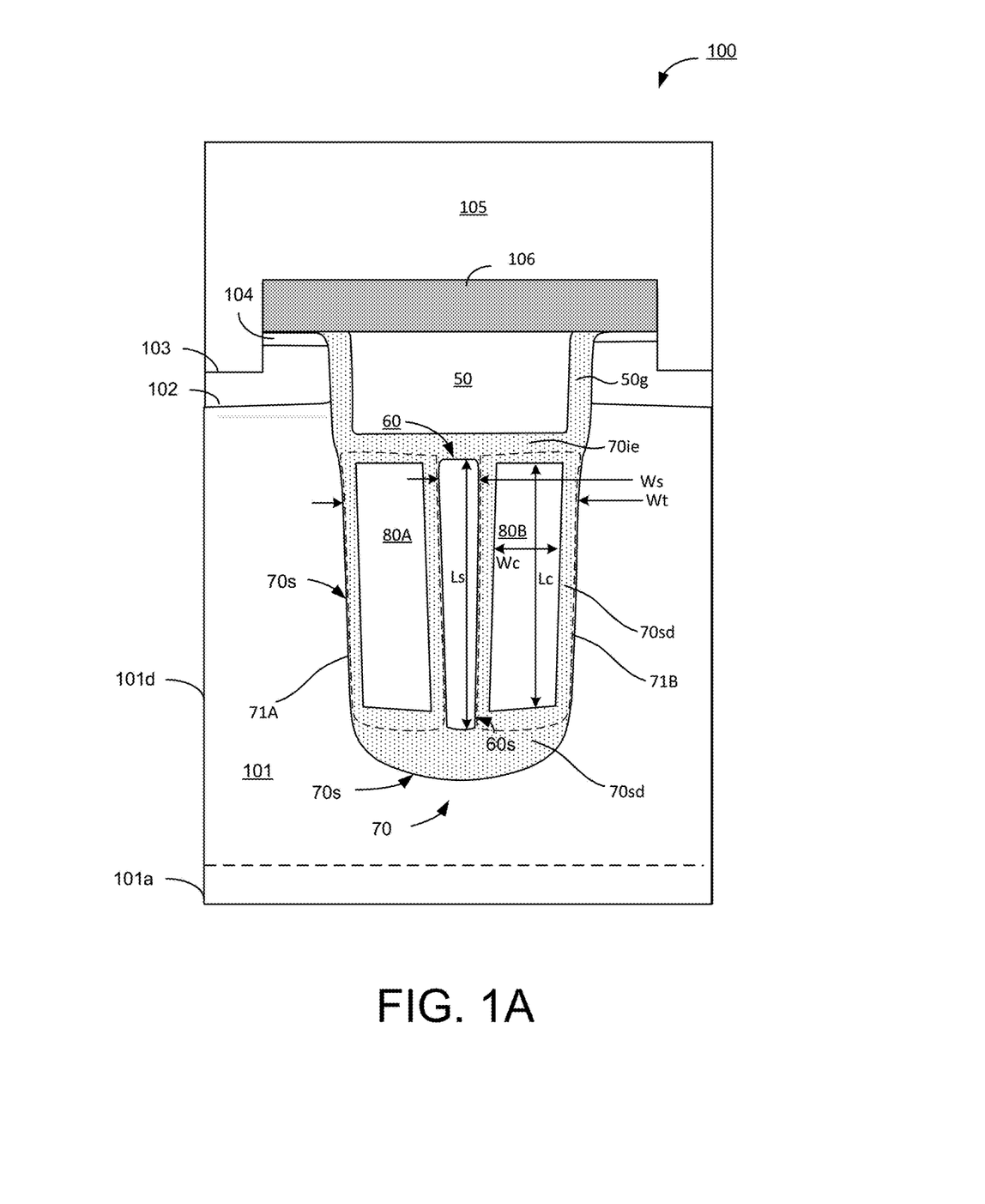
FIG. 1A is a schematic illustration, in cross-sectional view, of an example shielded gate trench metal-oxide-semiconductor field-effect transistor (MOSFET) device.

FIG. 1A is a schematic cross-sectional view of a unit cell of an example shielded gate trench MOSFET device 100 fabricated in a semiconductor substrate 101 (e.g., an n-type substrate), in accordance with principles of the present disclosure. Device 100 may include a vertical trench 70 (which can be referred to as a trench) etched in, for example, an epitaxial layer 101d that extends over, for example, a doped (e.g., highly doped) semiconductor substrate 101 (e.g., an n-type silicon substrate). A layer 101a of the doped silicon substrate 101 can function as at least a portion of a drain region in device 100.

In FIG. 1A, and other figures herein, features at a greater (or deeper) depth in the silicon substrate are shown toward the bottoms of the figures and features at a lesser (or shallower) depth are shown toward the tops of the figures. Although some features are described in terms of a p-type device, the dopant types can be reversed. Also, although some features are described in connection with one side of the MOSFET device 100, the features can be applied symmetrically to the opposite side of the MOSFET device 100.

In MOSFET device 100, a highly doped n-type source region 104 and a highly doped p-type heavy body region 103 are formed in a p-type well region 102, which is in turn formed in epitaxial layer 101d. Trench 70 (with a sidewall 70s) extends through well region 102 and terminates in the portion of epitaxial layer 101d bounded by well region 102 and drain contact layer 101a of silicon substrate 101, which portion can be referred to as the drift region.

Trench 70 includes a shield electrode 60 below a gate electrode 50. An insulating cap 106 (e.g., a BPSG layer) overlays the gate electrode 50 and functions to insulate gate electrode 50 from a conductive interconnect layer (e.g., layer 105). Interconnect layer 105 extends over the structure and makes contact with source region 104 and highly doped p-type heavy body region 103. Further, gate electrode 50 is insulated from well region 102 by a gate dielectric 50g. Gate electrode 50 and shield electrode 60 are insulated from each other by an inter-electrode dielectric layer (e.g., IED layer 70ie). The shield electrode 60 is embedded in, or surrounded by, portions of the solid dielectric material 70sd that extend from surfaces of the shield electrode 60 to sidewalls of the trench 70. In some implementations, the shield electrode 60 can be tied to a source potential, a ground potential, or can be at a floating potential.

Shield electrode 60 may have an elongated form extending from IED layer 70ie toward a bottom of trench 70 along a longitudinal (or vertical) axis of trench 70. Shield electrode 60 itself may be insulated from the drift region (and sidewall 70s of the trench) by a portion of shield dielectric 70sd disposed in trench 70. Shield dielectric 70sd may include, or be in contact with, IED layer 70ie that insulates shield electrode 60 from gate electrode 50. The IED layer 70ie can be formed during the formation of the gate dielectric 50g (using the same dielectric formation process).

As shown in FIG. 1A, the shield dielectric 70sd may be a structure that defines one or more gas cavities 80, in accordance with the principles of the present disclosure. In this implementation, the MOSFET device 100 includes gas cavity 80A on a first side of the shield electrode 60 and a gas cavity 80B on a second side of the shield electrode 60. The shield electrode 60 is disposed between (e.g., centered between, disposed laterally between) the gas cavities 80A, 80B. The shield dielectric 70sd may be a structure that includes one or more portions of solid dielectric material (e.g., silicon dioxide).

The inclusion of the gas cavities 80 in shield dielectric 70sd may result in a lower or reduced effective dielectric constant for the MOSFET device 100. Specifically, the inclusion of one or gas cavities 80 in shield dielectric 70sd may result in a lower or reduced effective (e.g., weighted average) dielectric constant for the MOSFET device 100 in a region (e.g., composite regions) around the shield electrode 60.

In some implementations, the gas cavities 80 and the shield dielectric 70sd can have portions included in shield dielectric composite regions 71A, 71B. Specifically, the shield dielectric composite region 71A can include portions of the shield dielectric 70sd and the gas cavity 80A, and the shield dielectric composite region 71B can include portions of the shield dielectric 70sd and the gas cavity 80B. The composite regions 71A, 71B can provide a lower or reduced effective (e.g., weighted average) dielectric constant for the MOSFET device 100.

In some implementations, the shield dielectric composite region 71A, 71B can be disposed below the gate electrode 50. In this implementation, the shield dielectric composite regions 71A, 71B can each be disposed laterally between the shield electrode 60 and a sidewall of the trench 70. The effective dielectric constant of each of the shield dielectric composite regions 71A, 71B, because they include respective gas cavities 80A, 80B, may be less than the dielectric constant of the solid materials used in the shield dielectric 70sd.

As shown in FIG. 1A, a length Lc (e.g., a vertical length) of the cavity 80B (or cavity 80A) can be less than a length Ls (e.g., a vertical length) of the shield electrode 60. In some implementations, the length Lc (e.g., a vertical length) of the cavity 80B (or cavity 80A) can be greater than or equal to the length Ls (e.g., a vertical length) of the shield electrode 60.

As shown in FIG. 1A, a top (e.g., a top surface) of the cavity 80B can be recessed relative to a top (e.g., a top surface) of the shield electrode 60. In other words, the top of the cavity 80B can be at a lower depth in the MOSFET device 100 than the top of the shield electrode 60. In some implementations, the top of the cavity 80B can be at the same depth in the MOSFET device 100 as the top of the shield electrode 60. In some implementations, the top of the cavity 80B can be higher in the MOSFET device 100 than the top of the shield electrode 60.

As shown in FIG. 1A, a bottom (e.g., a bottom surface) of the cavity 80B can be higher than a bottom (e.g., a bottom surface) of the shield electrode 60. In other words, the bottom of the shield electrode 60 can be at a lower depth in the MOSFET device 100 than the bottom of the cavity 80B. In some implementations, the bottom of the shield electrode 60 can be at a same depth in the MOSFET device 100 as the bottom of the cavity 80B. In some implementations, the bottom of the shield electrode 60 can be at a higher depth in the MOSFET device 100 than the bottom of the cavity 80B.

As shown in FIG. 1A, shield electrode 60 may have a width Ws orthogonal to the longitudinal axis of the trench 70 that is less than a width Wt of trench 70 orthogonal to the longitudinal axis of the trench 70. In some implementations, the width Ws of shield electrode 60 may be less than, equal to, or greater than a width We of cavity 80B (or cavity 80A), which is orthogonal to the longitudinal axis of the trench 70.

In some implementations, a cross-sectional surface area of the shield electrode 60 may be less than a cross-sectional surface area of the cavity 80B (and/or cavity 80A). The relatively large surface area of the cavity 80B (and/or cavity 80B) may be advantageous to reduce a dielectric constant. In some implementations, the cross-sectional surface area of the shield electrode 60 may be greater than or equal to the cross-sectional surface area of the cavity 80B (and/or cavity 80A).

In some implementations, the dielectric material filling the trench 70 may be referred to as capacitor material. In some implementations, the gate dielectric layer 50g and/or the shield dielectric 70sd may be solid materials (e.g., silicon dioxide, silicon nitride, silicon oxy-nitride, high-k dielectric materials and/or any combination thereof). These solid materials may have dielectric constants that are greater than the dielectric constants of gases. For example, silicon dioxide has a dielectric constant κ of about 3.9 while air has a dielectric constant κ=1.00059. An effective dielectric constant $\kappa_{\mathit{eff}}$ of the capacitor material filling trench 70 (i.e. dielectric composite regions 71A, 71B) may be a weighted average value of the dielectric constant of the solid material (e.g., silicon dioxide, κ=3.9) used in shield dielectric 70sd and the dielectric constant of the gas (e.g., air, κ=1.00059) used in gas cavities 80A, 80B. In example implementations, the effective dielectric constant κeff of the capacitor material filling trench 70 (i.e. dielectric composite regions 71A, 71B) may, depending on the relative sizes of shield dielectric 70sd and gas cavities 80A, 80B, have a value greater than 1.0 (air), but less than 3.9 (silicon dioxide).

The parasitic capacitances (e.g., Cgd) associated with a trench structure (e.g., trench 70) of a metal-oxide-semiconductor field-effect transistor (MOSFET) device (e.g., MOSFET device 100) may be modeled as a parallel plate capacitor with a capacitance C given by $C=(\kappa_{\mathit{eff}}*\varepsilon_0*A)/D$, where $\kappa_{\mathit{eff}}$ is the effective dielectric constant of the capacitor material filling the trench, $\varepsilon_0$ is the permittivity of air, A is the area of the plates, and D is the separation of the plates. In other words, the parasitic capacitances associated with a trench structure in a MOSFET device 100 can be proportional to κeff, the effective dielectric constant of the capacitor material filling the trench.

Since the effective dielectric constant κeff for the capacitor material with gas cavities 80 filling trench 70 (i.e. dielectric composite regions 71A, 71B) is less than the dielectric constants of solid capacitor materials (e.g., silicon dioxide, κ=3.9), the parasitic capacitance associated with device 100, shown in FIG. 1A, can be less than the parasitic capacitance associated with a traditional device that has only solid capacitor materials with no gas cavities as the trench fill.

In some implementations, gate electrode 50 and/or shield electrode 60 may, for example, be made of doped polysilicon, metal, silicide, cobalt silicide, titanium silicide, or any combination thereof. Although oxides are discussed in the context of some of the implementations, the oxides can be replaced by other dielectrics (e.g., silicon nitride, silicon oxy-nitride, high-k dielectric materials and/or any combination thereof)

Figure 1B:
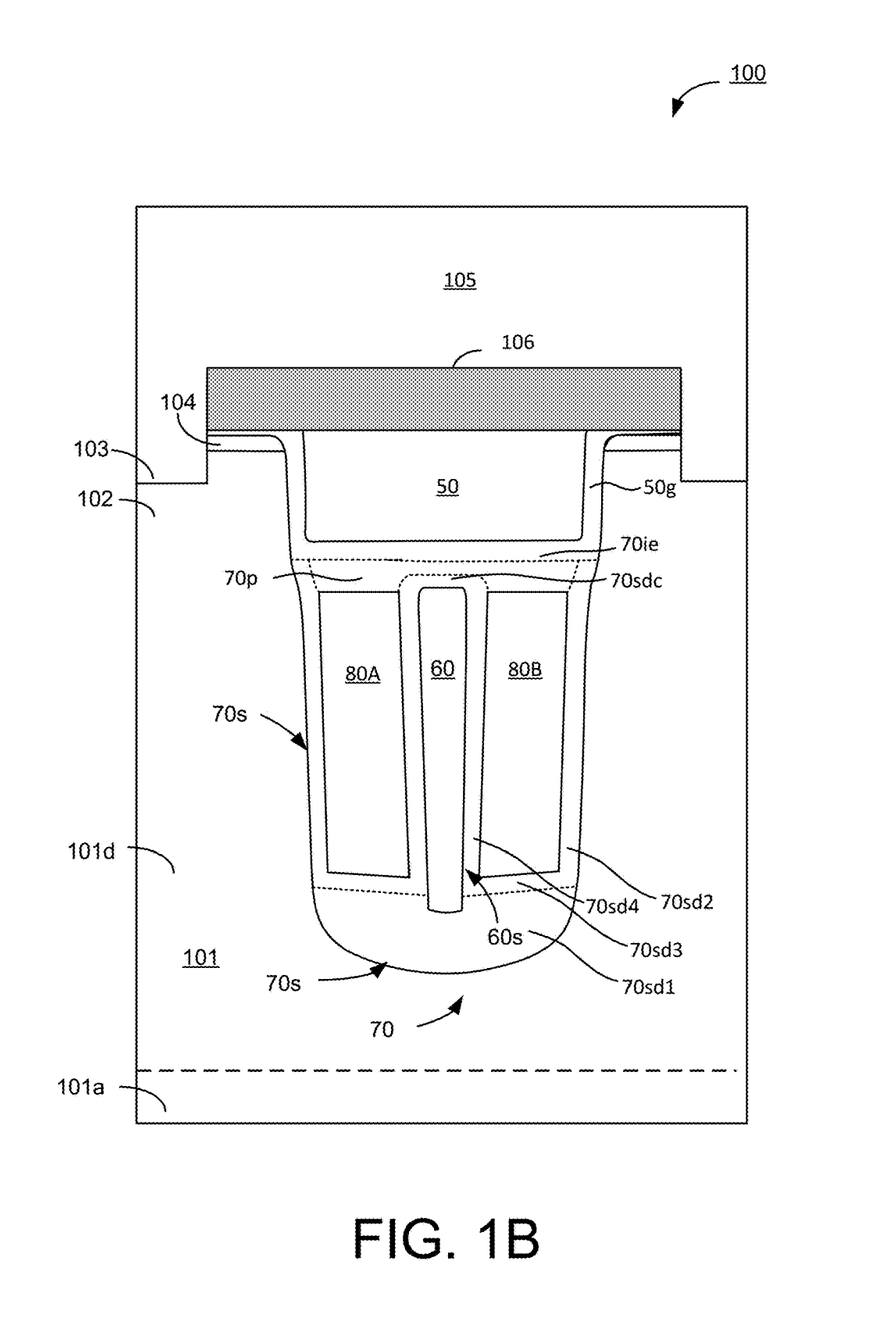
FIGS. 1B and 1C are schematic illustrations of variations of the shielded gate trench MOSFET device shown in FIG. 1A.

FIG. 1B shows the different portions of shield dielectric 70sd in an example implementation, in accordance with the principles of the present disclosure. As shown in FIG. 1B, in this example implementation, shield electrode 60 may have an elongated form (e.g., a plate like form) extending from IED layer 70ie toward a bottom of trench 70 along a longitudinal (or vertical) axis of the trench 70. The features described in connection with FIG. 1A will generally not be described again in connection with FIG. 1B to simplify the description. Although some features are described in connection with one side of the MOSFET device 100, the features can be applied symmetrically to the opposite side of the MOSFET device 100.

Shield electrode 60 may be embedded in, or surrounded by, shield dielectric 70sd in trench 70. Shield dielectric 70sd may include gas cavities 80A, 80B (e.g. an annular gas cavity or a part-annular cavity) that partially or completely surrounds shield electrode 60. The different portions of shield dielectric 70sd that include solid dielectric portions may, for example, include dielectric portion 70sd1, dielectric portion 70sd2, dielectric portion 70sd3, dielectric portion 70sd4, dielectric portion 70p, etc. The different solid dielectric portions may differ in the type of dielectric material (e.g., thermal oxide, deposited oxide, nitride, etc.), and or the manner or sequence in which the solid dielectric portions are created in a fabrication process.

In an example implementation, gas cavities 80 may, for example, have a cross section that has an elongated form (similar to that shield electrode 60) along the longitudinal axis of trench 70. Gas cavities 80 may be disposed between trench side wall 70s and shield electrode 60, and surround shield electrode 60 in trench 70.

Dielectric portion 70sd1 may, for example, be a portion of a dielectric (e.g., silicon dioxide) disposed (e.g., deposited) at the bottom of trench 70 on which shield electrode 60 and gas cavity 80 are formed in trench 70.

Dielectric portion 70sd2 may, for example, be a layer of dielectric (e.g., thermally grown oxide) disposed between trench side wall 70s and gas cavity 80. In some implementations, dielectric portion 70sd2 may extend upward along trench sidewall 70s above at least a portion of the shield electrode 60. In some implementations, dielectric portion 70sd2 may extend upward along trench sidewall 70s above shield electrode 60 and may be in contact with at a bottom surface of a portion of the gate dielectric 50g.

Dielectric portion 70sd3 may, for example, be a layer of dielectric (e.g., thermally grown oxide) disposed between dielectric 70sd1 and gas cavity 80B. Specifically, dielectric portion 70sd3 may, for example, be a layer of dielectric disposed between a top surface of dielectric 70sd1 and a bottom surface of the gas cavity 80B.

As shown in FIG. 1B, dielectric portion 70sd4 may be, for example, a layer of dielectric (e.g., thermally grown oxide) disposed between shield electrode 60 and gas cavity 80. In some implementations, dielectric portion 70sd4 may extend from dielectric portion 70sd1 (i.e., the base of deposited silicon dioxide) and may be aligned along (e.g., in contact with) sidewall 60s of shield electrode 60.

In some implementations, dielectric portion 70sd4 define a cap, labeled as dielectric portion 70sdc, over shield electrode 60. The dielectric portion 70sdc may have a concave surface (from the perspective of the shield electrode 60).

As shown in FIG. 1B, dielectric portion 70p may be a portion (e.g., a plug) of dielectric (e.g., deposited silicon oxide) disposed in trench 70 between gate electrode 50 and shield electrode 60. Dielectric portion 70$p$ may enclose (e.g., close, seal) the gas cavities 80A, 80B in trench 70.

Figure 1C:
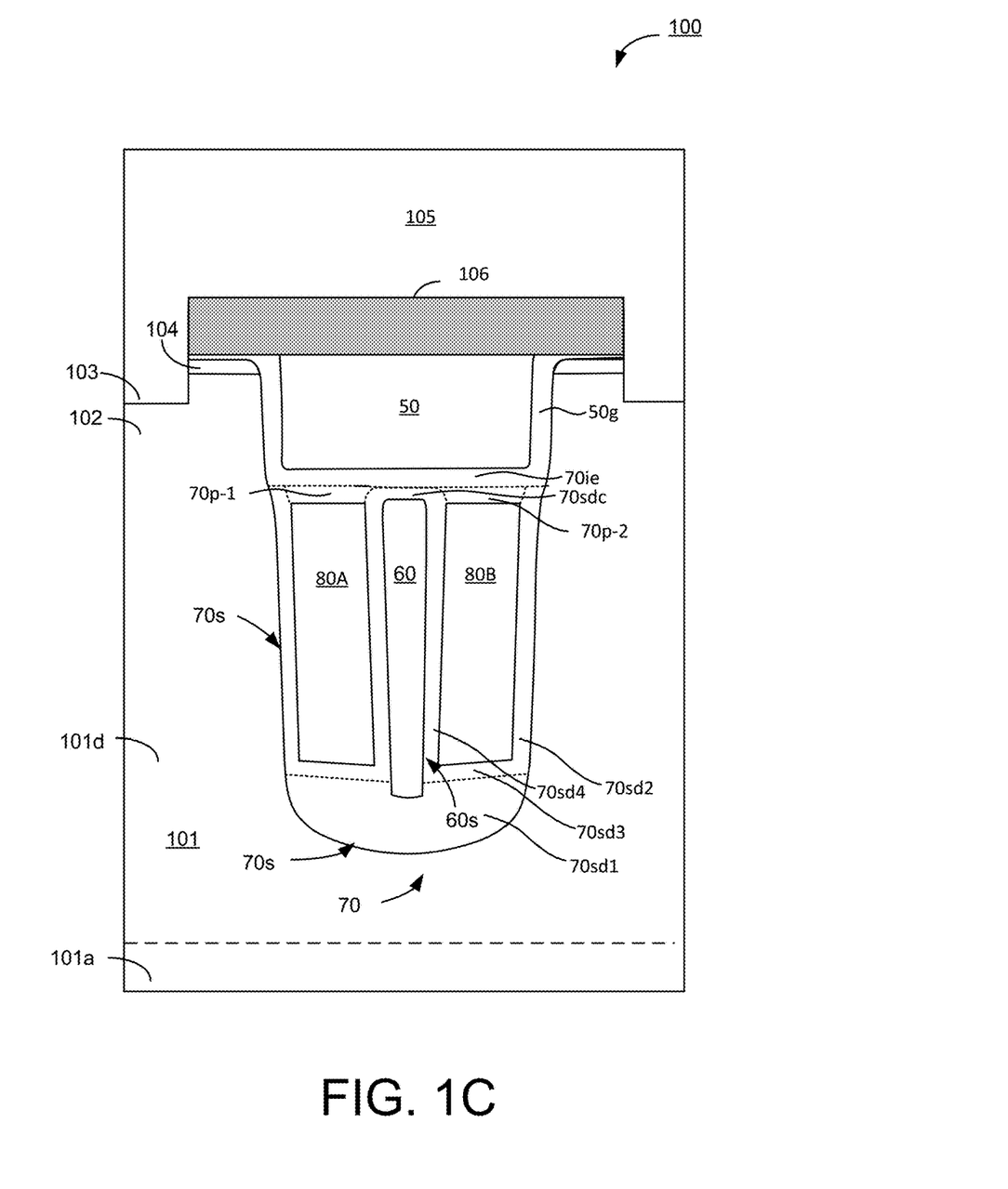

Although not shown in FIG. 1B, in some implementations, dielectric portion 70$p$ can have separate portions enclosing the gas cavities 80. Such an implementations is shown in FIG. 1C where the dielectric portion 70$p$ has a portion corresponding with each of the gas cavities 80A, 80B shown as dielectric portions 70$p$-1, 70$p$-2. For example, a first dielectric portion 70$p$-1 can enclose the gas cavity 80A, and a second dielectric portion 70$p$-2 can enclose the gas cavity 80B. In such implementations, the dielectric portion 70$sdc$ can separate the first dielectric portion 70$p$-1 from the second dielectric portion 70$p$-2. Also, in such implementations, the dielectric portion 70$sdc$ can be in contact with IED layer 70$ie$.

In some implementations the inter-electrode dielectric can include any of the dielectric layers (e.g., interelectrode dielectric 70$ie$, dielectric portions 70$sdc$, 70$p$) disposed between the gate electrode 50$g$ and the shield electrode 60 and cavities 80A, 80B.

The shielded gate MOSFET device 100 may be advantageous over conventional shielded gate MOSFET devices in that the combination of the shield electrode and gas cavities reduce the gate-drain capacitance (Cgd) and improve the breakdown voltage of the transistor without sacrificing the transistor on-resistance. An example semiconductor device fabrication process (e.g., process) for fabricating an example shielded gate trench field effect transistor (FET), in accordance with the principles of the present disclosure, is described in connection with FIGS. 2A-2M.

FIGS. 2A-2M show cross-sectional views of a semiconductor region (e.g., a substrate 201 and/or an epitaxial layer 202) as it is being processed through multiple steps of a process to fabricate the example MOSFET devices (e.g., shielded gate trench MOSFET device 100 shown in FIG. 1A), in accordance with the principles of the present disclosure.

The process may, for example, involve wafer level processing of the semiconductor region layer by layer. These steps may, for example, include photoresist coating, lithographic patterning, deposition, and removal of materials on (or of) the semiconductor region.

While like reference characters or numerals are used to label like elements throughout the various drawings in FIGS. 2A-2M, some of the elements are not labeled in some of the figures for visual clarity in views and for simplicity in description.

Figure 2A:
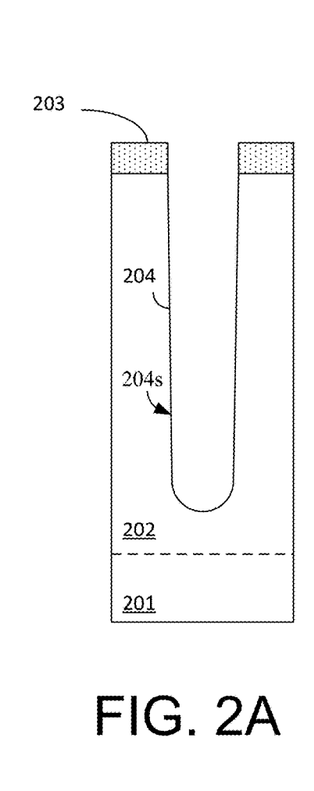
FIGS. 2A through 2M illustrate a series of cross-sectional views of a shielded gate trench MOSFET device through steps of an example fabrication process.

As shown in FIG. 2A, process may begin by etching a vertical trench 204 in a semiconductor region through a patterned mask (e.g., mask 203) deposited on a surface of the semiconductor region. Trench 204 may be etched, for example, in an epitaxial layer 202 grown on substrate 201. Substrate 201 may, for example, be conductive (e.g., a heavily doped) n-type silicon substrate. Epitaxial layer 202 may, for example, be a lightly doped (e.g., a lightly arsenic doped) n-type epitaxial layer grown over the silicon substrate 201. Trench 204 may have vertical or near vertical sidewalls 204$s$ and may terminate within epitaxial layer 202 (as shown) or may extend deeper (e.g., may terminate an interface between the epitaxial layer 202 and the substrate 201, may extend into and terminate in the substrate 201).

Figure 2B:
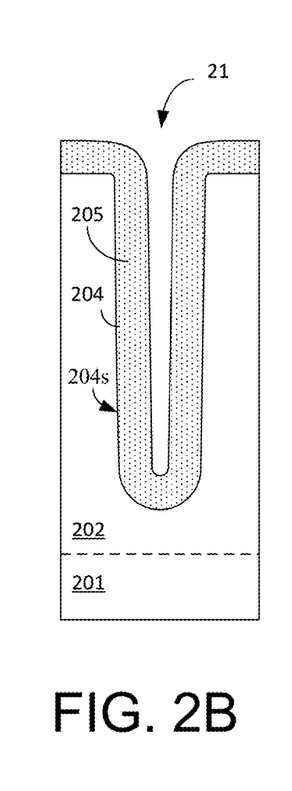

For forming the shield electrode, the process may include preparing a temporary shield electrode form in trench 204 by lining trench 204 with an oxide layer, depositing polysilicon to fill the temporary shield electrode form, recess etching the deposited polysilicon in the temporary shield electrode form to a height of the intended shield electrode, and removing the temporary shield electrode form. For example, the process can include growing or depositing a shield dielectric layer 205 (e.g., an oxide layer, shield oxide layer) on the sidewalls 204$s$ of trench 204 as shown in FIG. 2B. The shield dielectric layer 205 may be thick and may reduce a width of an opening 21 of trench 204. Shield dielectric layer 205 with opening 21 may serve as the temporary shield electrode form for the intended shield electrode (e.g., shield electrode 206 shown in FIG. 2D).

Figure 2C:
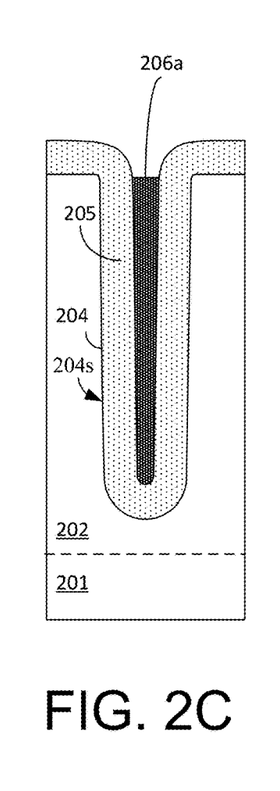
Figure 2D:
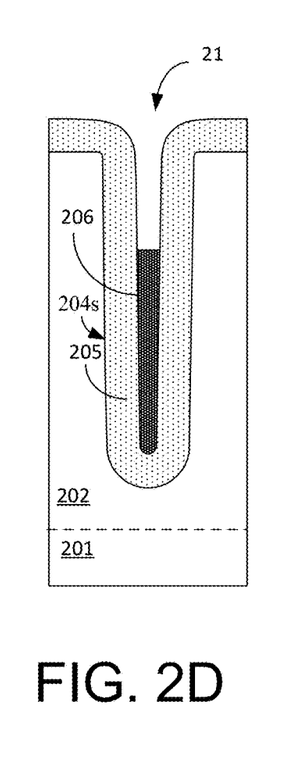

The process of forming the shield electrode 206 in opening 21 is illustrated in connection with at least FIGS. 2C and 2D. This process can include depositing polysilicon material 206$a$ through opening 21 to fill the temporary shield electrode form shown in FIG. 2C, chemical mechanical planarization (CMP) and a soft etch of the deposited polysilicon 206$a$ in the temporary shield electrode form, and a recess etching to form shield electrode 206 in a lower portion of trench 204 as shown in FIG. 2D.

Figure 2E:
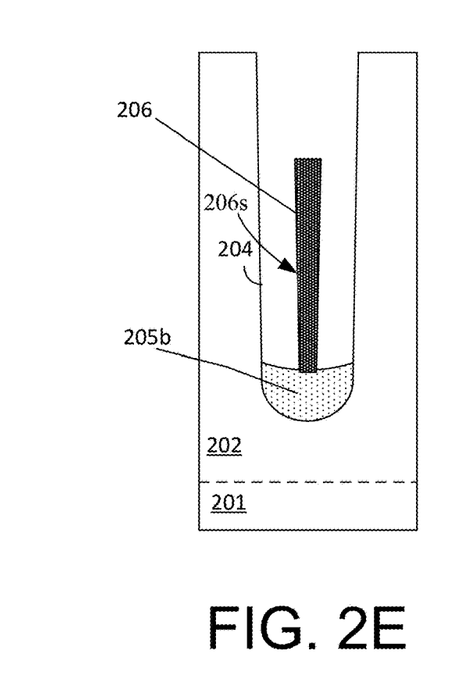

The process further includes removing shield dielectric layer 205 (e.g., by etching) from top surfaces of substrate 201 and upper portions of trench 204 as shown in FIG. 2E. As shown in FIG. 2E, the oxide etching (e.g., dielectric etching) may leave an unetched base portion 205$b$ of the shield oxide layer at the bottom of trench 204. Shield electrode 206 (with exposed surfaces 206$s$) may be disposed on (e.g., remain on, rest on) the base portion 205$b$ (which can correspond with dielectric portion 70$sd$1 shown in FIG. 1B).

Figure 2F:
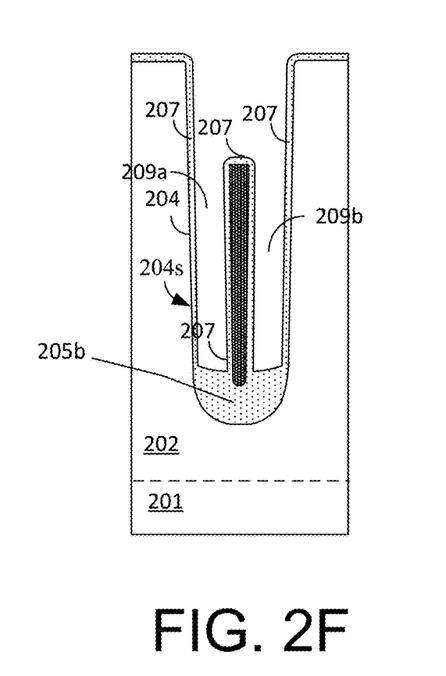

As shown in FIG. 2F, the process can include forming (e.g., growing) a dielectric layer 207 (e.g., a thermal oxide layer) on trench sidewall 204$s$ of trench 204 and the exposed surfaces (e.g., sidewall 206$s$) of shield electrode 206. The process may leave open cavities (e.g., open cavities 209$a$, 209$b$ (which can correspond with cavities 80A and 80B shown in FIG. 1B)) defined by dielectric layer 207. Open cavities 209$a$, 209$b$ may surround shield electrode 206, as shown in FIG. 2F. The dielectric layer 207 can have portions that correspond with, for example, dielectric portions 70$sd$2, 70$sd$3, 70$sd$4, 70$sdc$ shown in, for example, FIGS. 1B through 1C.

Figure 2G:
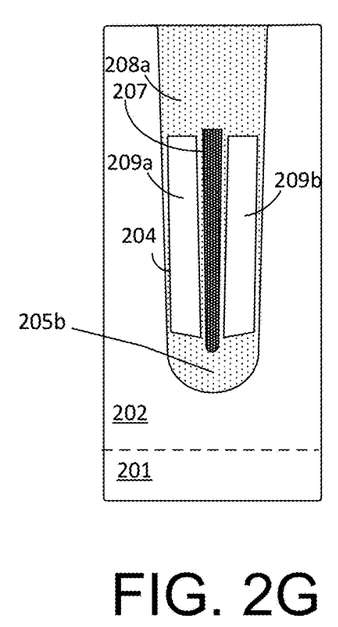
Figure 2H:
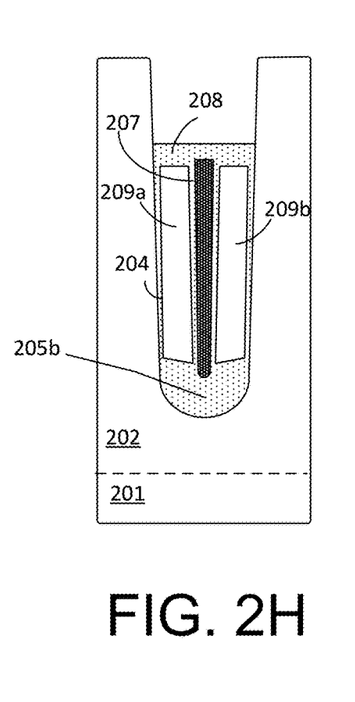

FIG. 2G illustrates depositing an oxide plug 208$a$ (e.g., dielectric plug, by chemical vapor deposition (CVD)) in upper portions of trench 204 over the top of shield electrode 206 to close open cavities 209$a$, 209$b$. Oxide plug 208$a$ may enclose the gas cavities 209$a$, 209$b$ in trench 204 adjacent to shield electrode 206. Gas cavities 209$a$, 209$b$ may be separated from shield electrode 206 by at least some portions of the dielectric layer 207. FIG. 2G shows, for example, the semiconductor region (after planarization) with oxide plug 208$a$ enclosing the gas cavities 209$a$, 209$b$ in trench 204.

FIG. 2G illustrates forming space for gate electrode 210 in trench 204 by etching back oxide plug 208$a$ to a smaller height (and thickness) plug 208. The upper portions of the sidewalls of the trench 204 are exposed by this etch.

Figure 2I:
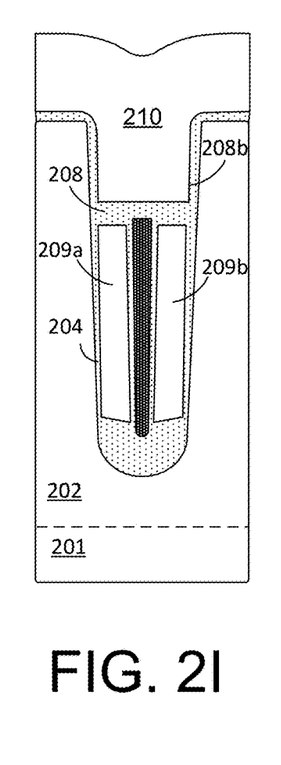

FIG. 2I illustrates depositing a gate dielectric 208$b$ (e.g., gate dielectric 50$g$ and IED layer 70$ie$ shown in FIGS. 1B and 1C) along the exposed upper sidewalls of the trench 204. FIG. 2I also illustrate forming (e.g., depositing) polysilicon to form gate electrode 210 above plug 208 (shown in FIG. 2I) and along the gate dielectric 208$b$ along the sidewalls (and inter-electrode dielectric disposed on the plug 208). In some implementations, the plug 208 can correspond with, for example, dielectric portion 70$p$ shown in FIGS. 1B through 1C.

Figure 2J:
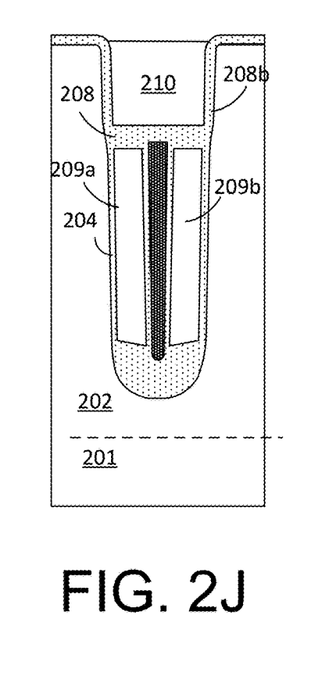
Figure 2K:
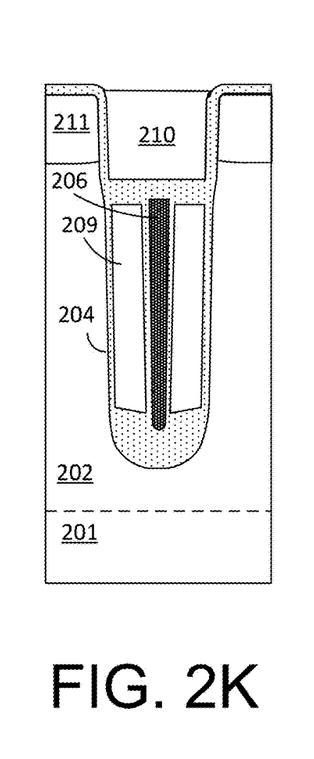

FIG. 2J shows, for example, the semiconductor region (after planarization) with the gate electrode 210 formed above oxide plug 208 in trench 204. FIG. 2K illustrates forming a p-well region 211 of the shielded gate trench MOSFET device. FIG. 2K also shows the semiconductor region after P-well implant and drive-in steps.

Figure 2L:
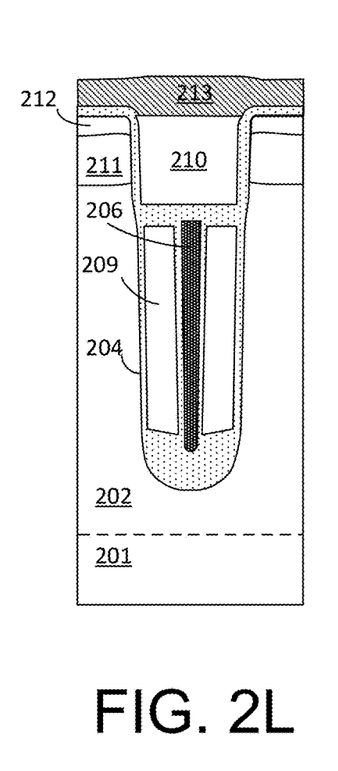

FIG. 2L illustrates N+ source implant and anneal steps to form source regions 212 of the shielded gate trench MOSFET device, and depositing an insulating layer (e.g., a borophosphosilicate glass (BPSG) layer 213) over the structure. FIG. 2L shows the semiconductor region after the N+ source implant and anneal steps to form source regions 212 and an insulating BPSG layer 213 covering the structure.

Figure 2M:
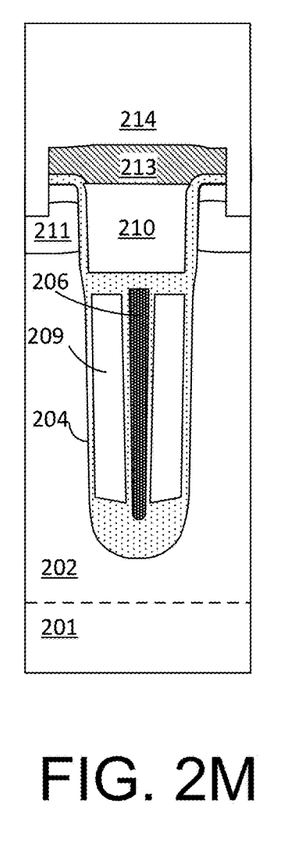

FIG. 2M illustrates a metallization step in which a patterned metal layer 214 may be deposited over the structure for source contact. Metal layer 214 may be insulated from gate electrode by insulating BPSG layer 213. FIG. 2M shows the semiconductor region with metal layer 214 for source contact in a completed cell of the example FET (e.g., shielded gate trench MOSFET device 100 shown in FIG. 1A) fabricated by the process.

Use of the gas cavities in the shield dielectrics of shielded gate trench MOSFETs can reduce switching power loss in the devices by reducing parasitic capacitances of the devices. Further, in some implementations, for fixed capacitance values, shield dielectric thickness may be reduced in devices using gas cavities compared to traditional devices with solid shield dielectrics. The reduction of parasitic capacitance by the use of gas cavities in the shield dielectrics can result in improvement of Rsp and unit cell pitch.

In an example comparison, device performance can be simulated for four example shielded gate test devices—test devices A, B, C and D. The results of the comparisons are shown in FIGS. 3 through 6. Each test device can have the same trench depth (e.g., a few microns) and the same active area factor. Devices A, B and C can have have trenches with dielectric fills that include gas cavities, and device D (reference device D) can have a trench with a solid dielectric fill (i.e., without an gas cavity). The three devices A, B and C with gas cavities are simulated at cell pitches of small, medium, and large, respectively. The reference device D without an gas cavity is simulated at the large cell pitch.

Figure 3:
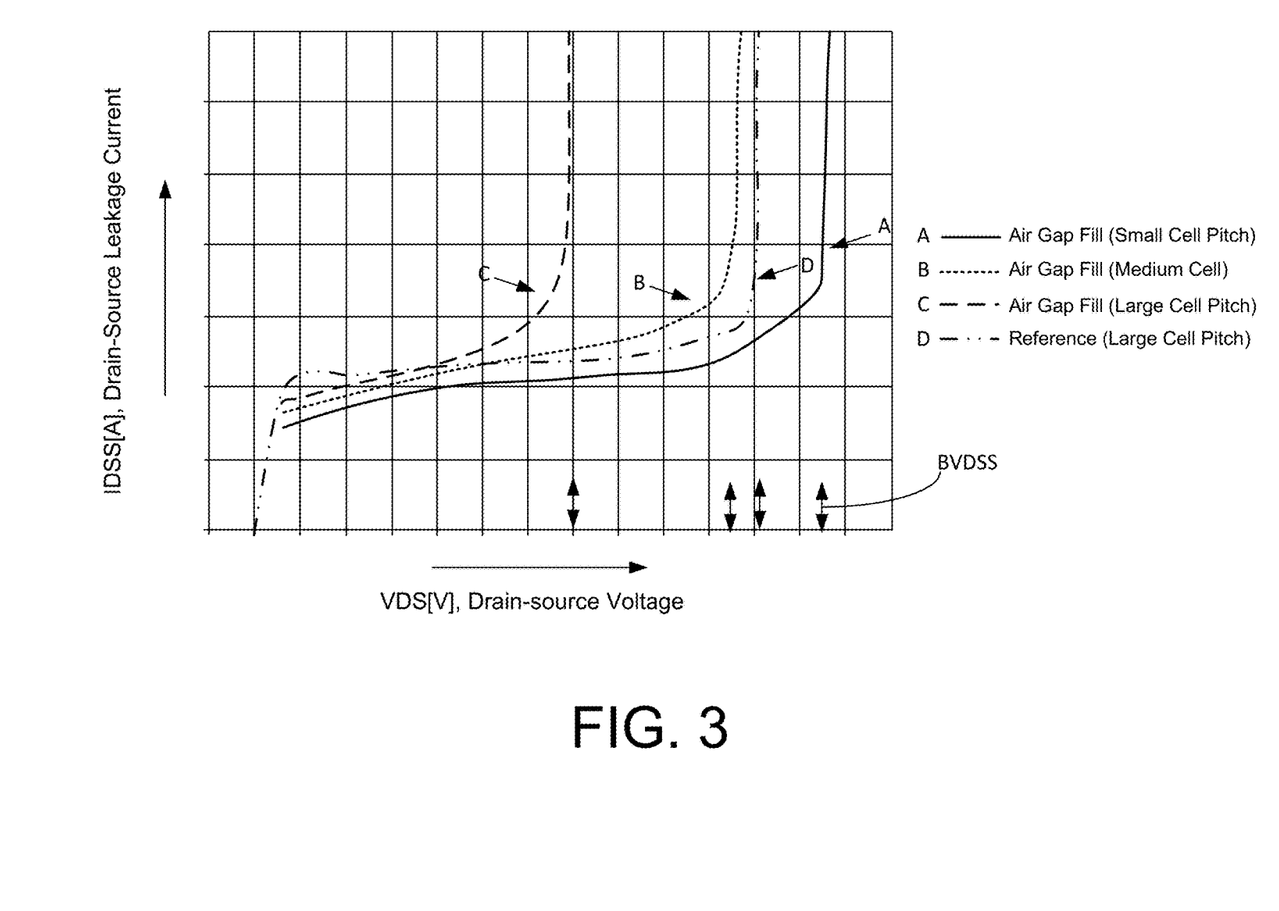
FIG. 3 illustrates simulations of drain to source current as a function of drain to source voltage for shielded gate trench MOSFET devices with different gas gap cell pitches.
Figure 4:
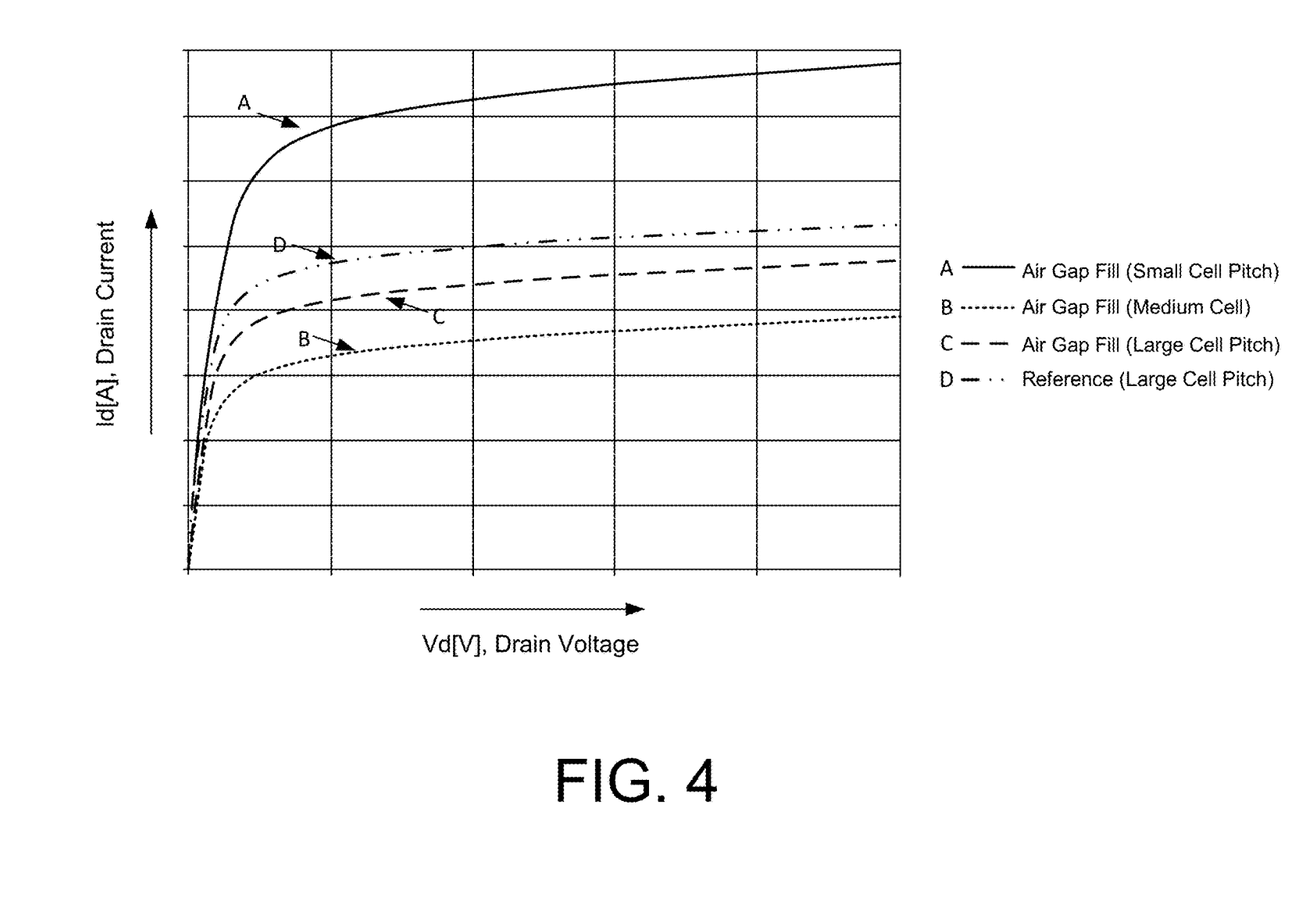
FIG. 4 illustrates simulations of drain current as a function of drain voltage for shielded gate trench MOSFET devices with different gas gap cell pitches.

FIG. 3 shows the simulated drain to source current (IDSS), and FIG. 4 shows the simulated drain current (ID) as a function of drain-source voltage (VDS) for the example devices A, B, C, and D. The breakdown voltage (BVDSS) of a MOSFET is a voltage at which a reverse-biased body-drift diode in the MOSFET breaks down and significant drain to source leakage current starts to flow. The BVDSS values may be measured at the same Idss. FIG. 3 illustrates that devices A, B, and C have BVDSS values of that decrease from device A through C, respectively, (as marked by bold double-headed arrows along the x axis in FIG. 3). Reference device D has a BVDSS value between that of device A and B. Notably, device A (having a gas cavity) with a small cell pitch has a BVDSS value that is higher than the BVDSS value of the reference device D (having no gas cavity) with a large cell pitch.

Further, a drain-source on resistance (Rds(on)) of the devices can be determined as a slope (Vds/Ids) in a linear region of the devices. Rds(on) may be measured at the same Id of a few amps for each of the test devices. FIG. 4 illustrates notably that device A (having an gas cavity) with a small cell pitch has an Rds(on) value that is about the same as the Rds(on) value of the reference device D (having no gas cavity) with a large cell pitch.

FIG. 4 also shows that the maximum loading current (ID) for device A (having an gas cavity) is greater by around 44% over the maximum loading current (ID) for reference device D (having no gas cavity) as measured, for example, at the same drain voltage Vd.

Figure 5:
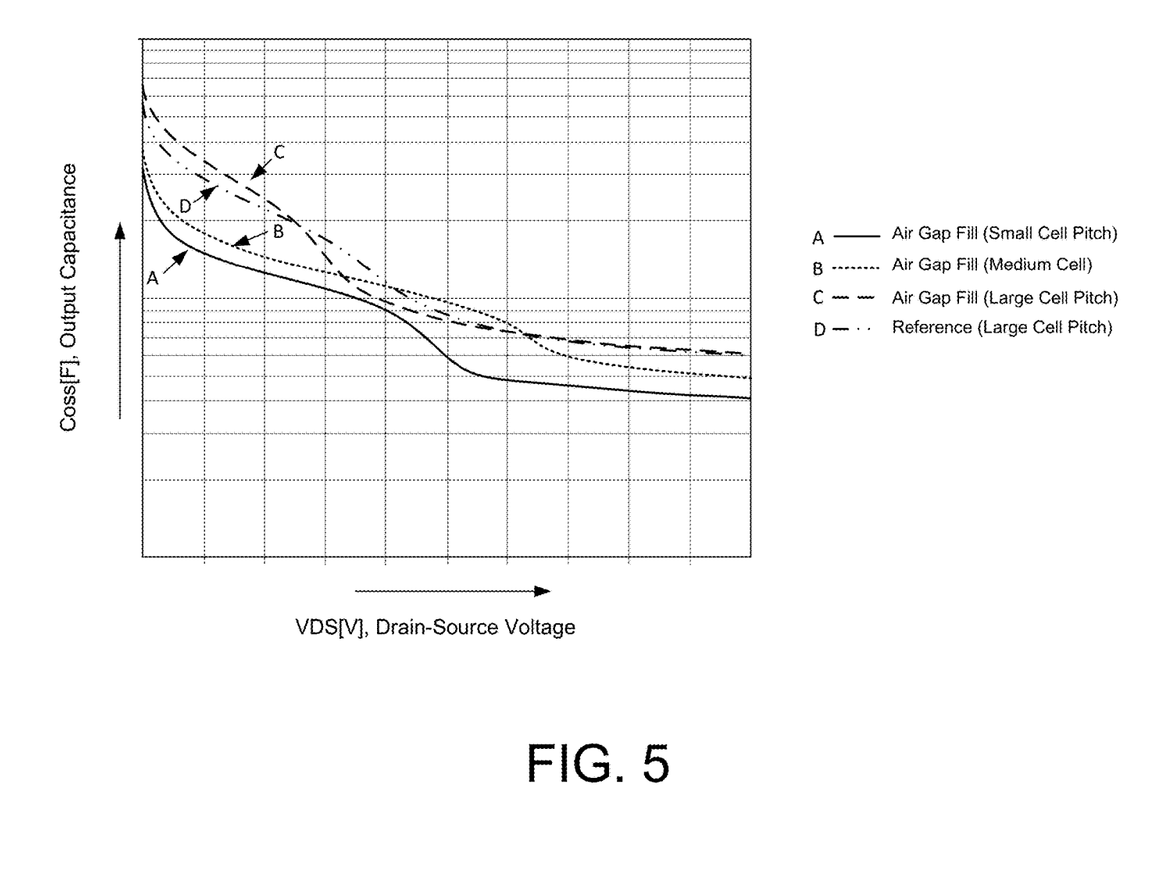
FIG. 5 illustrates simulations of output capacitance as a function of drain to source voltage for shielded gate trench MOSFET device with different gas gap cell pitches.
Figure 6:
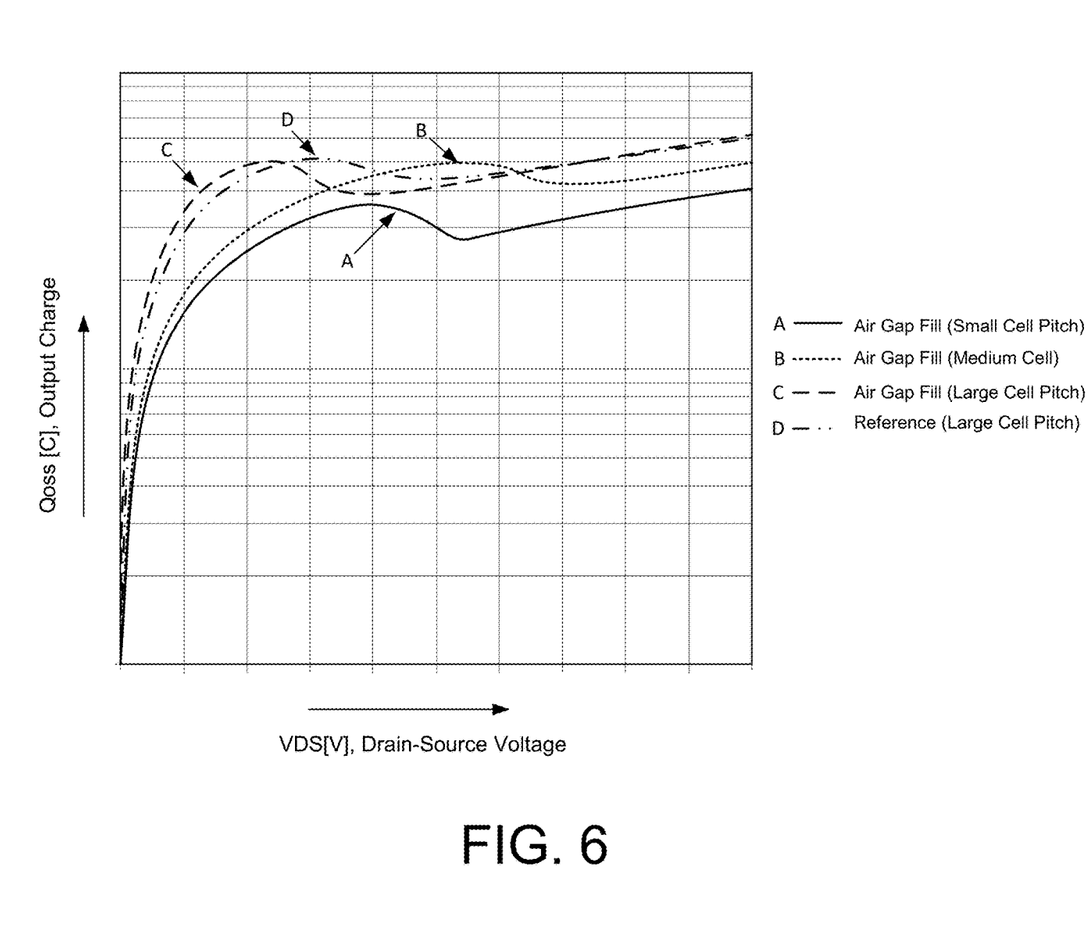
FIG. 6 illustrates simulations of output charge as a function of drain voltage for shielded gate trench MOSFET device ith different gas gap cell pitches.

FIG. 5 shows the simulated drain to output capacitance ($C_{OSS}$), and FIG. 6 shows the simulated output charge ($Q_{OSS}$) as a function of drain voltage (VD) for the example devices A, B, C, and D. Switching parameters such as Coss can represent the combined parasitic gate-to-drain capacitance and drain to source capacitance of the MOSFET and such as Qoss (related to Coss) can represent the output charge of a MOSFET. FIG. 5 shows that the output capacitance ($C_{OSS}$) of the devices (A, B, C and D) is reduced as the cell pitch of the devices is reduced. Similarly, FIG. 6 shows that the output charge ($Q_{OSS}$) of devices A, B, and C (having an gas cavity) is reduced as the cell pitch of the devices is reduced. Notably, FIGS. 5 and 6 show device A (having an gas cavity) with a small cell pitch has Coss and Qoss values that are lower than the Coss and Qoss values of the reference device D (having no gas cavity) with a large cell pitch.

A low specific resistivity (Rsp) may be required for achieving chip size shrink and high maximum loading current for implementations of shielded gate trench power MOSFETs. The simulation results shown in FIGS. 3 through 6 suggest that a gas cavity can be utilized in the shield dielectrics to achieve low specific resistivity (Rsp) in the shielded gate trench power MOSFETS. Further, for a given Rds(on) value, utilization of an gas cavity in the shield dielectric increases the break down voltage (BVDSS) of the device. Further, use of the gas cavity reduces output capacitance (Coss) and output charge (Qoss). This reduction in Coss and Qoss can reduce power loss in switching applications of the device.

A measure of a switching performance of a MOSFET device can be determined by the specific on-resistance (Rsp) or resistance per unit die area when the device is switched on. Lower Rsp values correspond to faster switching of the MOSFET device. Another measure of the switching performance of a MOSFET device can be the characteristic gate-drain charge Miller charge (Qgd), which determines how much voltage or power is needed to drive or turn-on the device. A figure of merit (FOM) of particular interest for discrete MOSFET devices combines both the Rsp and Cgd measures: FOM=Qgd*Rsp. MOSFETS with lower FOMs may be expected to have better performance than MOSFETS with higher FOMs. The overall FOM can be improved (e.g., decreased) by the gas cavity trench MOSFET devices described herein.

Figure 7:
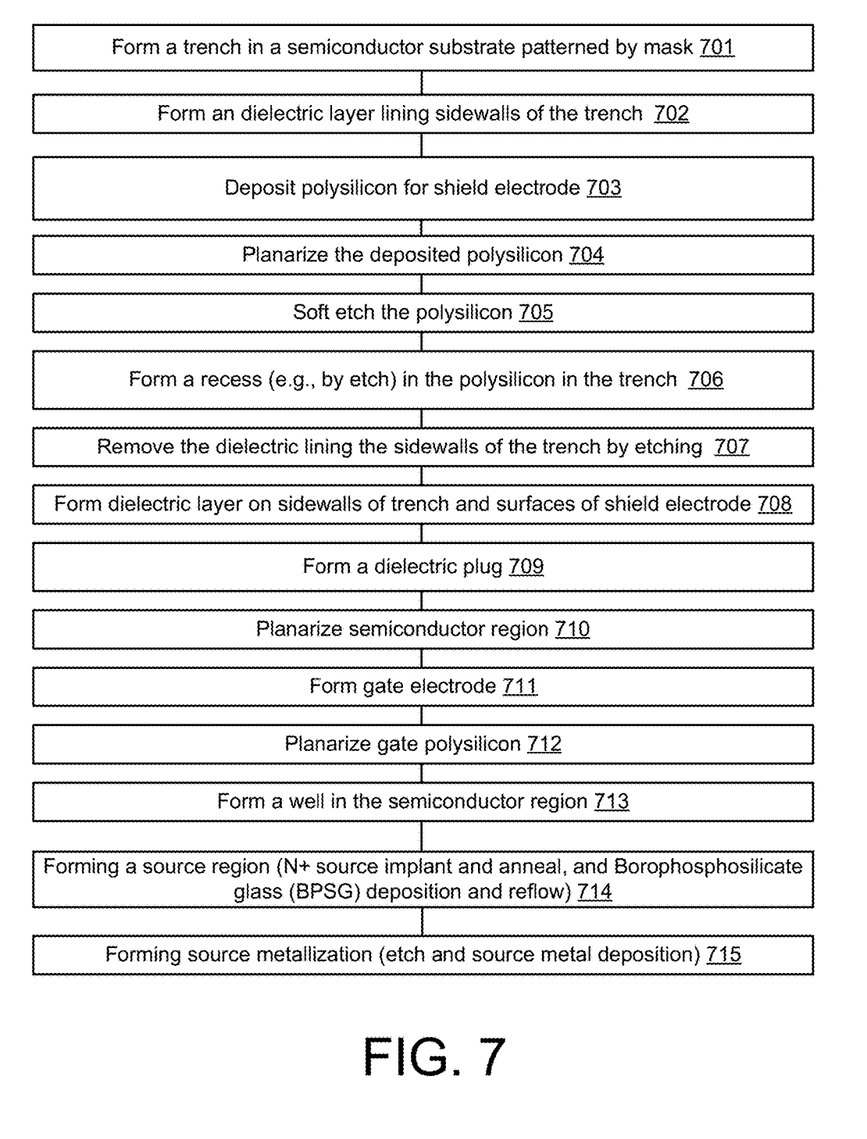
FIG. 7 is a flowchart of a method for fabricating a shielded gate trench MOSFET device.

FIG. 7 is a flowchart that illustrates an example method 700 for fabricating the devices described herein. The method illustrated in FIG. 7 can be used to produce the shielded gate trench MOSFETs (e.g., trench MOSFET device 100 shown in FIGS. 1A through 1C) having one or more cavities in shield dielectric structures that reduce the effective dielectric constants of the shield dielectric structures of the devices and improve the performance of the devices.

As shown in FIG. 7, method 700 includes forming a trench in a semiconductor substrate (block 701). Openings on the semiconductor substrate may patterned by a mask (e.g., hard mask) and the trench may be etched through an opening in the mask (see FIG. 2A).

FIG. 7 illustrates forming (e.g., growing, depositing) a dielectric layer lining sidewalls of the trench (block 702). The dielectric lining may create a temporary shield electrode form for an intended shield electrode in the trench (see e.g., FIG. 2B).

FIG. 7 illustrates depositing polysilicon for the intended shield electrode over the substrate and in the trench (block 703), planarizing (e.g., by chemical mechanical polishing (CMP)) the deposited polysilicon (block 704), soft etching the polysilicon (block 705), and forming a recess (e.g., by etching) in the polysilicon in the trench (block 706). At 706, the deposited polysilicon in the trench may be recessed or etched back to an intended height of the shield electrode (see e.g., FIG. 2D).

FIG. 7 illustrates removing the dielectric lining the sidewalls of the trench (i.e. the temporary shield electrode form in the trench created at 702) by etching (block 707). Wet etching may be used in some implementations. The wet etching may leave an unetched portion of the dielectric at the bottom of the trench as a base dielectric portion on which the shield electrode may rest (see e.g., FIG. 2E).

FIG. 7 illustrates forming (e.g., growing) a dielectric (e.g., thermal oxide layer) on sidewalls of trench and surfaces of shield electrode (block 708). The dielectric layer on the sidewalls of the trench and the dielectric layer on the surfaces may define an open cavity surrounding the shield electrode (see e.g., FIG. 2F).

FIG. 7 illustrates forming (e.g., depositing (e.g., by CVD)) a dielectric plug (e.g., an oxide plug) in the trench (block 709), and planarizing the semiconductor region (e.g., substrate) (block 710). The dielectric plug encloses (e.g., seals, closes) the open cavity formed in the trench at 708 (see e.g., FIG. 2G).

FIG. 7 illustrates forming a gate electrode in the trench (block 711). Step 711 may involve a selective etching (e.g., using an inter-poly dielectric (IPD) etch) of the dielectric plug to make room for the gate electrode, gate dielectric, and gate polysilicon deposition. The method may further include planarizing the semiconductor region (e.g. by CMP) after the gate polysilicon deposition (block 712) (see e.g., FIG. 2J).

After a gate electrode is formed in the trench at block 711, FIG. 7 illustrates forming a well (e.g., a p-well region) in the semiconductor region (block 713) and forming a source region in the semiconductor region (block 714). Forming the well (block 713) may involve a well implant and drive-in (see e.g., FIG. 2K). Forming the source region (block 714) may include a source implant (e.g., N+ source implant) and anneal, and borophosphosilicate glass (BPSG) deposition and reflow (see e.g., FIG. 2L).

FIG. 7 illustrates forming source metallization (block 715). The source metallization at 715, may, for example, involve etching and source metal deposition over the substrate to make source contacts of the device (see. e.g. FIG. 2M).

It will also be understood that when an device element, such as a source, drain, electrode, or dielectric layer or other device component, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

While certain features of the described implementations have been illustrated as described herein, many modifications, substitutions, changes and equivalents will now occur to those skilled in the art. It is, therefore, to be understood that claims, if appended, are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A transistor comprising:
a trench defined in a semiconductor substrate and having a sidewall;
a gate electrode disposed in the trench and insulated from the sidewall of the trench by a gate dielectric; and
a shield electrode disposed in the trench below the gate electrode and insulated from the gate electrode and the sidewall of the trench by a shield dielectric,
the shield dielectric including a cavity disposed between the shield electrode and the sidewall of the trench.

2. The transistor of claim 1, wherein the cavity surrounds the shield electrode.

3. The transistor of claim 1, wherein the trench and the shield electrode are aligned along a longitudinal axis, and the cavity has a width orthogonal to the longitudinal axis that is greater than a width of the shield electrode orthogonal to the longitudinal axis.

4. The transistor of claim 1, wherein the shield dielectric includes an inter-electrode dielectric layer insulating the gate electrode from the shield electrode.

5. The transistor of claim 1, wherein the shield dielectric includes a plug layer disposed below the gate electrode and enclosing the cavity.

6. The transistor of claim 1, wherein the shield dielectric includes a base portion of deposited dielectric material, and wherein the shield electrode rests on the base portion.

7. The transistor of claim 1, wherein the shield dielectric includes a first thermally grown oxide portion disposed between the sidewall of the trench and the cavity.

8. The transistor of claim 7, wherein the first thermally grown oxide portion extends along the sidewall of the trench above shield electrode and merges with the gate dielectric.

9. The transistor of claim 1, wherein the shield dielectric includes a second thermally grown oxide portion disposed between the shield electrode and the cavity and defining a sidewall of the cavity.

10. The transistor of claim 9, wherein the second thermally grown oxide portion extends along surfaces of the shield electrode to form a cap over the shield electrode.

11. A transistor comprising:
    a trench defined in a semiconductor substrate and having a sidewall,
    a gate electrode disposed in the trench and insulated from the sidewall of the trench by a gate dielectric;
    a shield electrode disposed in the trench below the gate electrode and insulated from the gate electrode; and
    a shield dielectric having a first portion aligned along a sidewall of the shield electrode and a second portion aligned along the sidewall of the trench, the first portion of the shield dielectric and the second portion of the shield dielectric defining a cavity within the trench.

12. The transistor of claim 11, wherein the cavity reduces an output capacitance of the transistor relative to a transistor having a trench with a solid dielectric material fill without the cavity.

13. The transistor of claim 11, wherein the shield electrode includes polysilicon and the shield dielectric includes a thermally grown silicon dioxide and or a deposited silicon dioxide.

14. The transistor of claim 11, wherein the gate electrode is disposed above a third portion of the shield dielectric that encloses the cavity in the trench.

15. The transistor of claim 11, wherein the cavity and the shield electrode are disposed on a fourth portion of the shield dielectric disposed at a bottom of the trench.

16. A method, comprising:
    forming a trench in a semiconductor substrate;
    forming a bottom dielectric in the trench;
    forming a shield electrode on the bottom dielectric in the trench;
    forming a shield dielectric surrounding the shield electrode in the trench, the shield dielectric including an open cavity between the shield electrode and a sidewall of the trench; and
    forming a plug dielectric portion in the trench to enclose the open cavity in the trench.

17. The method of claim 16, wherein forming a shield electrode in the trench includes:
    preparing a temporary shield electrode form in the trench by lining the trench with an oxide layer;
    depositing polysilicon to fill the temporary shield electrode form;
    recess etching the deposited polysilicon in the temporary shield electrode form to a height of the shield electrode; and
    removing the temporary shield electrode form.

18. The method of claim 17, wherein forming the shield dielectric surrounding the shield electrode in the trench includes:
    growing a thermal oxide on the sidewall of the trench and on surfaces of the shield electrode to define the open cavity between the shield electrode and the sidewall of the trench.

19. The method of claim 18, wherein the forming a plug dielectric portion in the trench to close the open cavity in the trench includes:
    depositing silicon dioxide in the trench; and
    recessing the deposited silicon dioxide to form the plug dielectric portion closing the open cavity in the trench.

20. The method of claim 19, further comprising:
    depositing polysilicon over the semiconductor substrate and in the trench above the plug dielectric portion; and
    chemical mechanical polishing the deposited polysilicon to form a gate electrode above the plug dielectric portion in the trench.

* * * * *